(12) United States Patent
Siefering

(10) Patent No.: US 11,309,178 B2
(45) Date of Patent: Apr. 19, 2022

(54) TREATMENT SYSTEMS WITH REPOSITIONABLE NOZZLE USEFUL IN THE MANUFACTURE OF MICROELECTRONIC DEVICES

(71) Applicant: TEL MANUFACTURING AND ENGINEERING OF AMERICA, INC., Chaska, MN (US)

(72) Inventor: Kevin L. Siefering, Excelsior, MN (US)

(73) Assignee: TEL MANUFACTURING AND ENGINEERING OF AMERICA, INC., Chaska, MN (US)

(*) Notice: Subject to any disclaimer, the term of this patent is extended or adjusted under 35 U.S.C. 154(b) by 161 days.

(21) Appl. No.: 16/677,016

(22) Filed: Nov. 7, 2019

(65) Prior Publication Data

US 2020/0161124 A1 May 21, 2020

Related U.S. Application Data

(60) Provisional application No. 62/767,632, filed on Nov. 15, 2018.

(51) Int. Cl.
*H01L 21/687* (2006.01)
*H01L 21/67* (2006.01)
(Continued)

(52) U.S. Cl.
CPC .......... *H01L 21/02041* (2013.01); *B08B 3/02* (2013.01); *H01L 21/67051* (2013.01);
(Continued)

(58) Field of Classification Search
CPC ......... H01L 21/67051; H01L 21/67109; H01L 21/67748; H01L 21/68714; B05B 15/68
See application file for complete search history.

(56) References Cited

U.S. PATENT DOCUMENTS

| 3,090,403 A | * | 5/1963 | Heinz | ................... F16L 51/029 |
| | | | | 138/121 |
| 4,159,133 A | | 6/1979 | Belanger | |

(Continued)

FOREIGN PATENT DOCUMENTS

WO WO-2017090505 A1 * 6/2017 ............ B08B 3/024

*Primary Examiner* — Natasha N Campbell
(74) *Attorney, Agent, or Firm* — Kagan Binder, PLLC

(57) ABSTRACT

The invention provides treatment systems useful to treat microelectronic workpieces with one or more treatment fluids dispensed onto a workpieces from one or more nozzle assemblies. The nozzle assemblies are easily moveable and positionable to change distance and/or angle of nozzle orientation relative to the substrates being treated. The nozzle assemblies are easily and quickly adjustable on demand. Adjustment may be manual or automated. The present invention is based at least in part upon coupling the nozzle directly or indirectly to a flexible bellows. As the bellows is flexed up or down or tilted, etc., the nozzle is moved in a corresponding manner. For example, the nozzle outlet can be moved closer or further away from the surface of the substrate being processed. The angle of the nozzle assembly, and hence the angle of the spray dispensed from the nozzle, with respect to the substrate can also be altered if desired.

23 Claims, 9 Drawing Sheets

(51) Int. Cl.
*H01L 21/677* (2006.01)
*B05B 15/68* (2018.01)
*H01L 21/02* (2006.01)
*B08B 3/02* (2006.01)

(52) U.S. Cl.
CPC .. *H01L 21/67109* (2013.01); *H01L 21/67748* (2013.01); *H01L 21/68714* (2013.01); *B05B 15/68* (2018.02)

(56) References Cited

U.S. PATENT DOCUMENTS

| | | | |
|---|---|---|---|
| 5,320,148 | A | 6/1994 | Asciutto |
| 5,899,653 | A | 5/1999 | Brodine |
| 6,284,006 | B1 | 9/2001 | Siefering et al. |
| 6,397,653 | B1 * | 6/2002 | Kane ............... B60D 5/003 72/299 |
| 10,014,191 | B2 | 7/2018 | Mbanaso et al. |
| 10,020,217 | B2 | 7/2018 | Butterbaugh |
| 10,062,596 | B2 | 8/2018 | Butterbaugh et al. |
| 2002/0195422 | A1 * | 12/2002 | Sievers ............ H01L 21/32136 216/62 |
| 2008/0226826 | A1 * | 9/2008 | Tanaka ............. H01L 21/76849 427/299 |
| 2016/0096206 | A1 | 4/2016 | Butterbaugh et al. |
| 2016/0096207 | A1 | 4/2016 | Butterbaugh |
| 2017/0341093 | A1 | 11/2017 | Hanzlik |
| 2018/0025904 | A1 | 1/2018 | DeKraker |
| 2018/0269080 | A1 | 9/2018 | Schwab et al. |
| 2018/0337067 | A1 * | 11/2018 | Kosai ............... H01L 21/32134 |

* cited by examiner

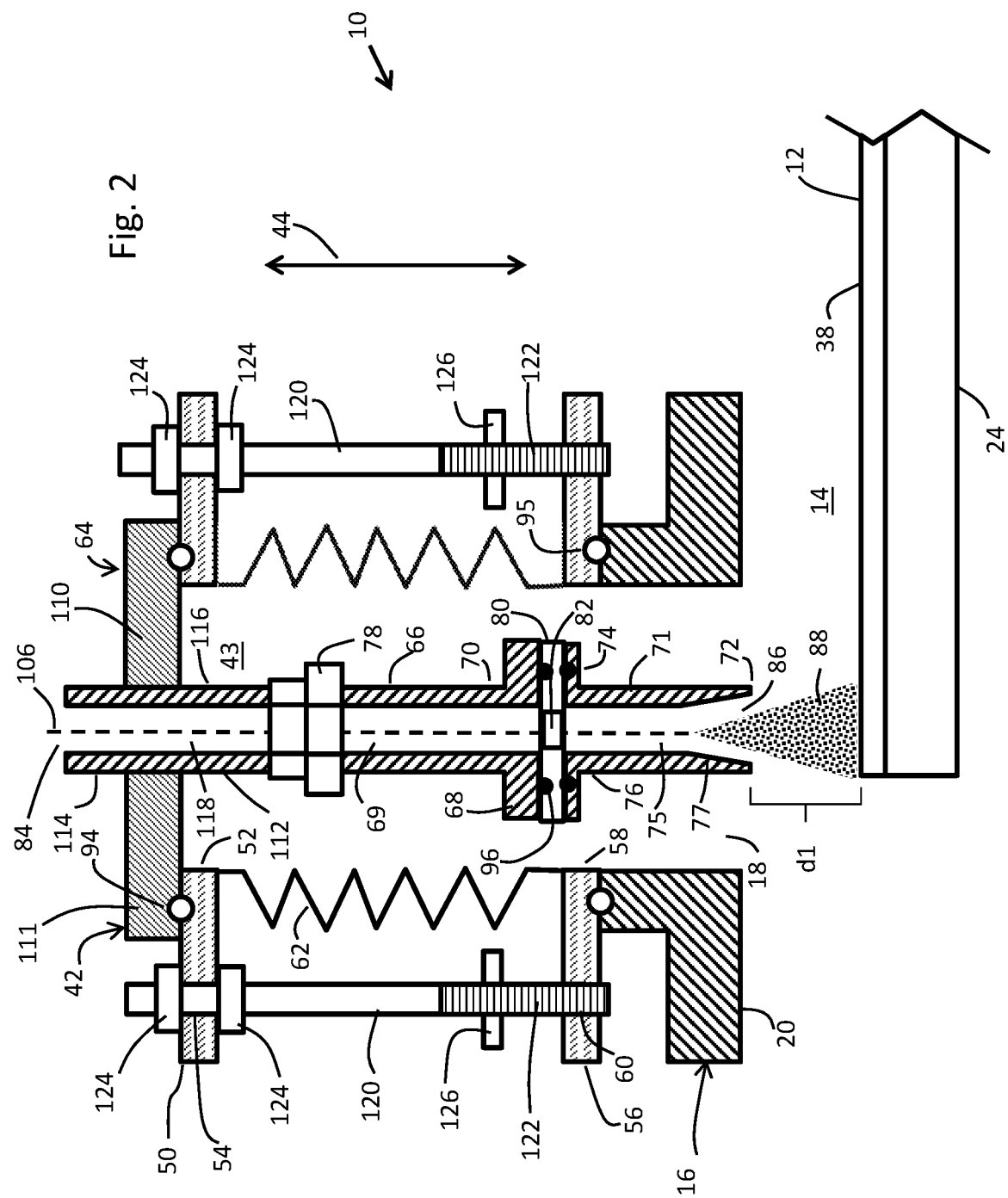

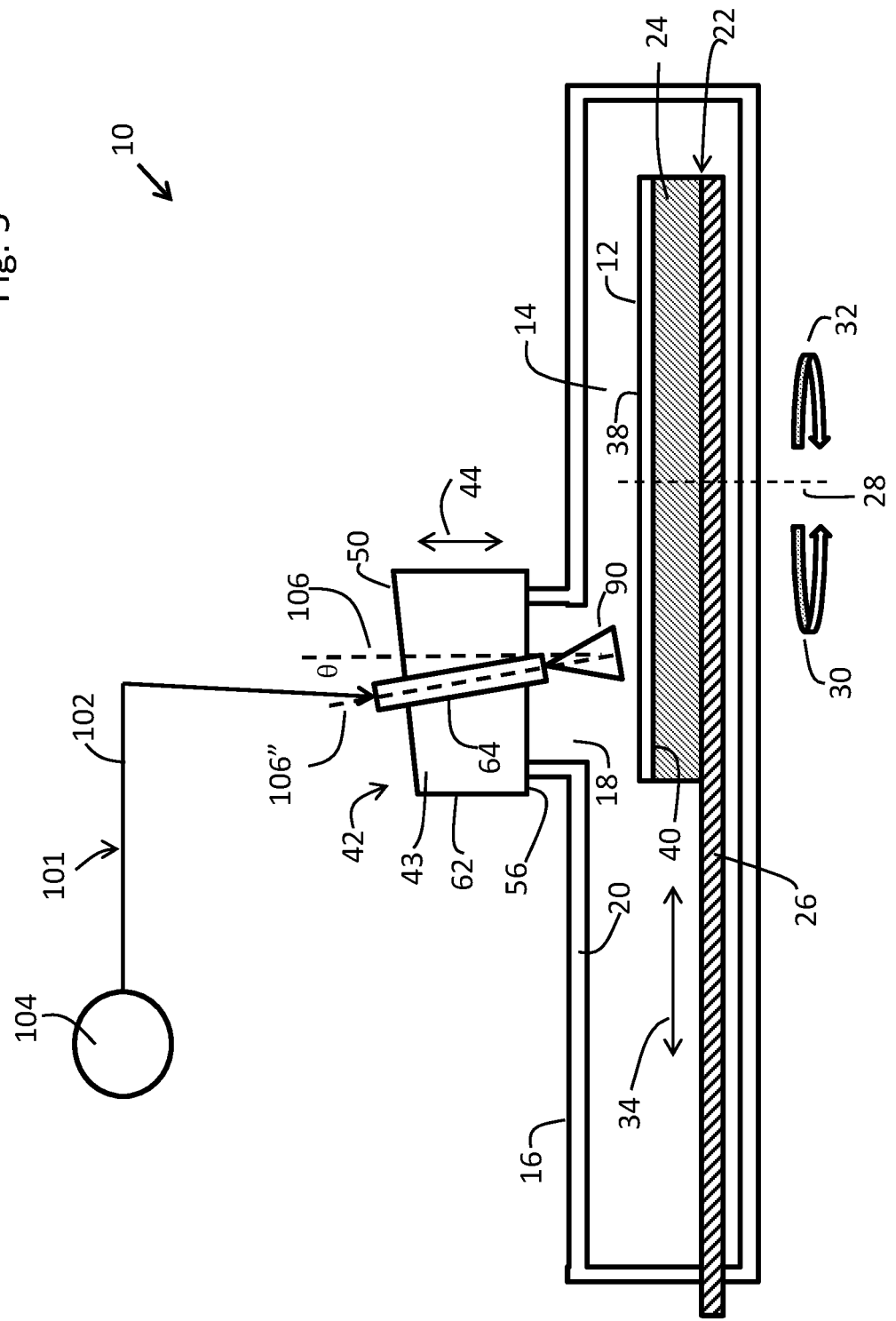

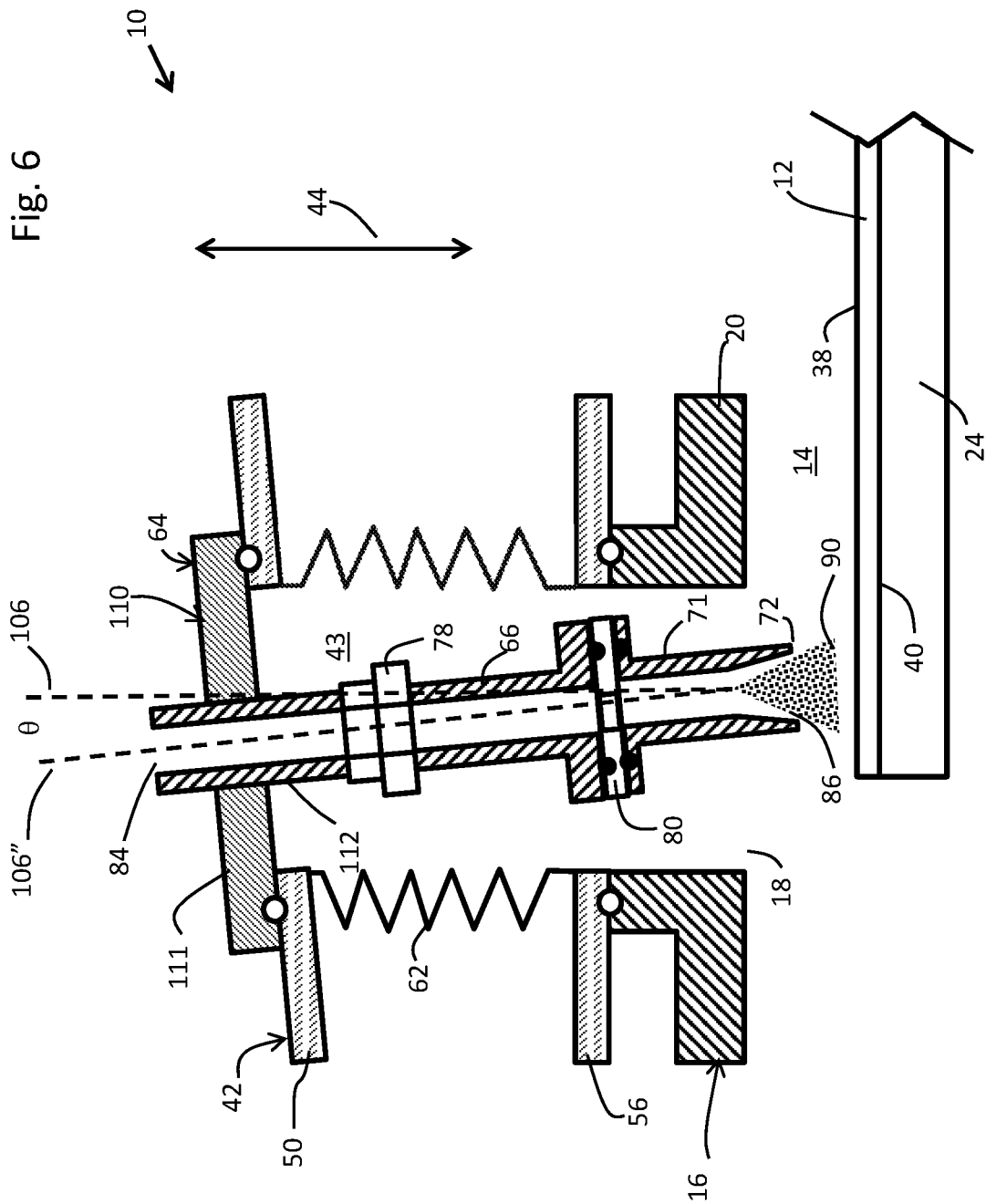

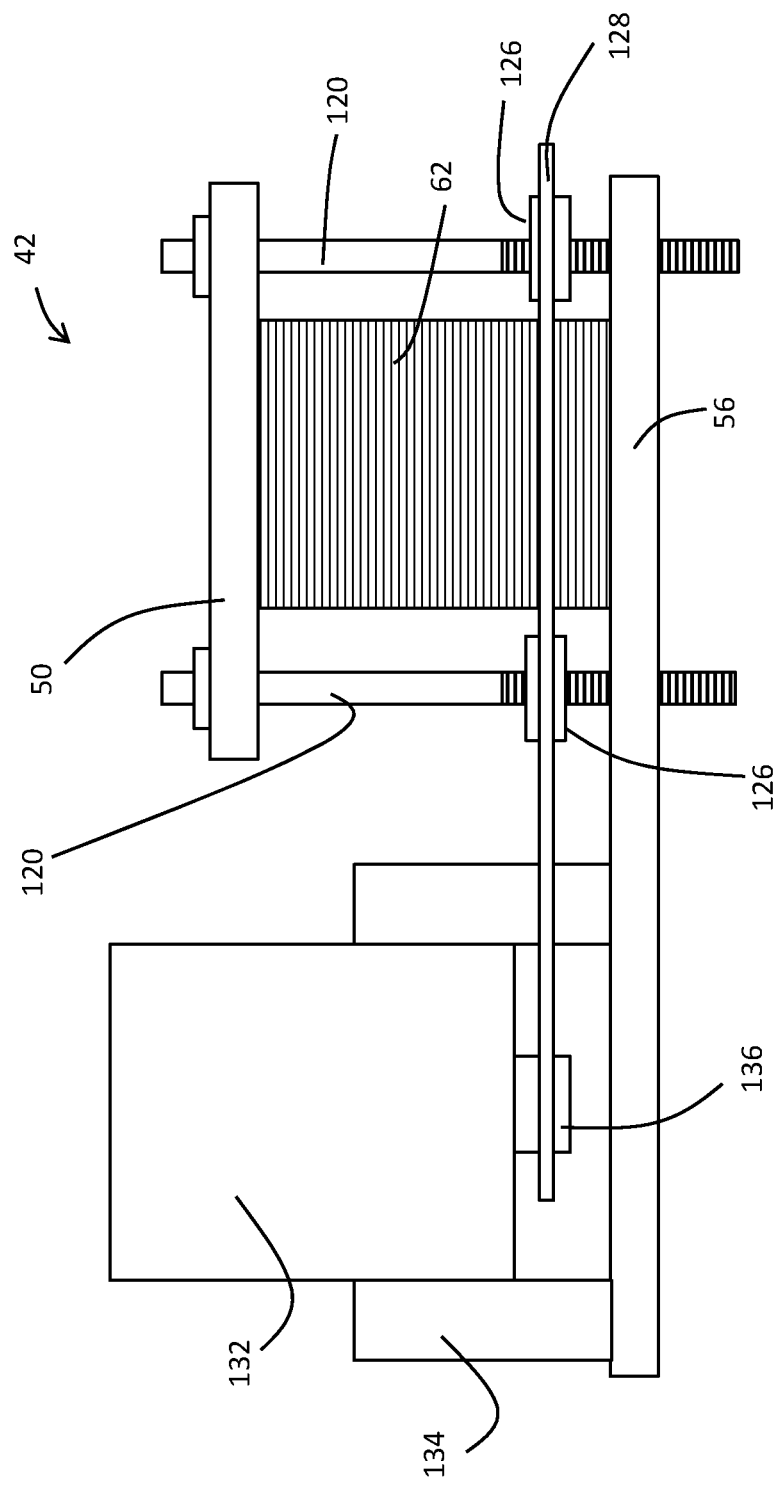

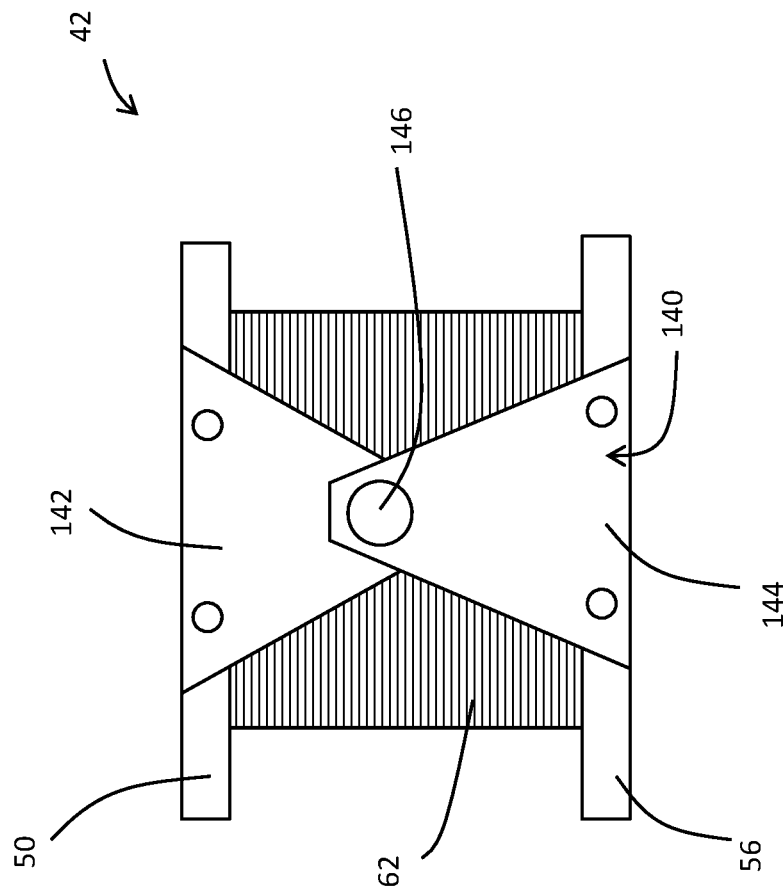

TREATMENT SYSTEMS WITH REPOSITIONABLE NOZZLE USEFUL IN THE MANUFACTURE OF MICROELECTRONIC DEVICES

PRIORITY

The present nonprovisional patent application claims priority under 35 U.S.C. § 119(e) from United States Provisional patent application having Ser. No. 62/767,632, filed Nov. 15, 2018, by Siefering and titled Treatment Systems With Repositionable Nozzle Useful in the Manufacture of Microelectronic Devices wherein the entirety of said provisional patent application is incorporated herein by reference for all purposes.

FIELD OF THE INVENTION

The present invention relates to treatment systems in which a microelectronic substrate is treated with fluid materials sprayed onto the substrate through a nozzle. More particularly, the present invention relates to such treatment systems wherein a nozzle is coupled to a bellows structure that allows the nozzle to be moveable and positionable.

BACKGROUND OF THE INVENTION

Many processes used in the manufacturing of microelectronic devices involving positioning one or more microelectronic substrates, e.g., in-process devices at various stages of manufacture, into a sealed chamber. One or more treatment fluids are supplied to one or more nozzles and then dispensed into the chamber to treat the substrate(s) in the desired manner. Often, the fluids are dispensed directly at the substrate surface(s). Exemplary treatments can be used to deposit material, remove material, chemically alter surfaces, physically alter surfaces, rinse surfaces, remove particles or other contaminants or debris from surfaces, and the like.

Cryogenic treatment processes are widely known and used to remove particles and other contamination from substrate surfaces. These treatments generally rely on the energy of fluids dispensed at high velocity to dislodge and carry away the contamination. Some of these treatments may also incorporate aspects that chemically alter the surface or the contamination in order to make it easier for the high velocity streams to dislodge and carry away the contamination. Generally, cryogenic treatments used in the microelectronic industry involve supplying one or more pressurized and cooled fluid streams to one or more nozzles. The fluid(s) are then dispensed into the sealed chamber from the nozzle, being aimed at the surfaces to be cleaned. The chamber typically is under vacuum. When the pressurized and cooled fluid is dispensed from the nozzle into the lower pressure regime of the chamber, the fluid is converted into energetic, high velocity sprays of solid, liquid, gas, and/or gas cluster particles. The sprays in some instances may include very finely sized particles on a nanoscale. The sprayed material collides with, dislodges, and carries away the contamination.

TEL FSI, Inc. (Chaska, Minn.) manufactures and markets a series of tool systems under the brand indicia "ANTARES™" that are useful to carry out cryogenic cleaning treatments in the manufacture of microelectronic devices. The tools in the ANTARES™ series are fully automated, single-wafer, systems useful for processing wafers (including 200 nm or 300 mm wafers). Each system uses cryogenic aerosol technology to safely remove nanoscale particles from workpiece surfaces. Unlike conventional wet technologies, this all-dry process reduces defects and minimizes risks of damaging the wafer surface, even on metal and low-k films. The tools of the ANTARES™ series offer enhanced defect removal and are suitable for treating a wide range of materials.

In a typical cryogenic cleaning treatment, such as exemplary processes used by the tools of the ANTARES™ series, the substrate to be cleaned (e.g. a semiconductor wafer) is typically held in a horizontal orientation on a chuck inside a sealed chamber. The chamber often is under vacuum. An expansion nozzle is positioned over the substrate surface during processing. The nozzle includes at least one outlet to spray treatment material at the substrate surface. A pressurized and cooled fluid or fluid mixture is supplied to the nozzle. The material is then jetted through the nozzle into the low pressure chamber at the substrate. Material is sprayed from the nozzle at high velocity. The spray may include solid, liquid, gas, and/or gas cluster particles. Due to the small size of the particles, the resultant spray may be referred to as a nano-aerosol. These high velocity aerosols effectively dislodge and remove contaminants such as particles from the surface of the substrate.

In such processes, it may be advantageous to adjust the distance from the nozzle outlet to the substrate surface and/or the relative angle of the nozzle to the substrate in order to optimize the cleaning process for either contaminant removal or prevention of damage to sensitive structures on the substrate. Nozzle adjustment could be desirable not only between different treatments but also during the course of a treatment. One current practice is cumbersome. It involves shutting down tool operation and removing the nozzle assembly. The nozzle assembly can be reconfigured to achieve the new, desired configuration. Alternatively, a different nozzle assembly having the desired configuration may be installed instead. This conventional process typically requires several hours to make a single adjustment. It also poses a risk of introducing undue amounts of ambient contamination into the chamber that may require tool conditioning before the tool can be returned to service. A tool including a nozzle assembly that is easier to adjust is highly desired. Such functionality is desired not only to change the nozzle configuration between recipes but also to quickly adjust the configuration during a process so that adjustment does not unduly extend cycle time.

SUMMARY OF THE INVENTION

The present invention provides systems useful in the manufacture of microelectronic devices to treat workpieces with one or more treatment fluids. The systems include nozzle assemblies that are easily moveable and positionable to change distance and/or angle of orientation relative to the substrates being treated. The nozzle assemblies are easily and quickly adjustable on demand. Adjustment may be manual or automated. The adjustments may be made at any time such as between processes, during processes, to move the nozzle out of the way for easier chamber access, and the like. For example, the nozzle assembly can be positioned differently for different substrates with different cleaning requirements, different thickness, and/or damage sensitivity. It could even be adjusted as a recipe step variable to allow different heights and/or angles at different steps in the recipe to process a single substrate. It may also be advantageous to raise the nozzle farther away from the substrate surface at completion of processing to allow the substrate to be lifted off of the chuck for removal of the substrate by a robot without translating the chuck away from the nozzle first. This could either reduce or eliminate the need for a lateral translation capability for the chuck.

The present invention is based at least in part upon coupling the nozzle directly or indirectly to a flexible bellows. The bellows may be used, for example, to allow relative movement of the nozzle outlet inside a sealed process chamber with respect to the surface of a substrate. As the bellows is flexed up or down or tilted, etc., the nozzle is moved in a corresponding manner. For example, the nozzle outlet can be moved closer or further away from the surface of the substrate being processed. The angle of the nozzle assembly, and hence the angle of the spray dispensed from the nozzle, with respect to the substrate can also be altered if desired.

Adjustments of the position of the nozzle assembly may be accomplished manually, such as by using knobs or hand tools. Alternatively, adjustments may be automated in many embodiments, such as being controlled with a suitable controller coupled to a suitable actuation device such as an electric motor, mechanical linkage, or the like.

In one aspect, the present invention relates to 1. A system for treating a microelectronic substrate with at least one treatment fluid, said system comprising:
  a) a sealed chamber;
  b) a chuck comprising a substrate holding portion in the sealed chamber, wherein the microelectronic substrate is positioned on the substrate holding portion during a process treatment
  c) a flexible and resizable enclosure coupled to the sealed chamber, said flexible and resizable enclosure comprising a flexible bellows coupled to a moveable and positionable support member in a manner such that actuation of the flexible bellows moves the moveable and positionable support member;
  d) a moveable and positionable nozzle assembly coupled to the support member in a manner effective to allow the nozzle assembly to be moved and positioned relative to the substrate holding portion in response to movement and positioning of the moveable and positionable support member in response to actuation of the flexible bellows, wherein the nozzle assembly comprises at least one inlet to receive at least one fluid from a fluid supply and at least one outlet to introduce at least one fluid into the sealed chamber. Optionally, the substrate holding portion is translatable and/or rotatable while holding the microelectronic substrate;

In another aspect, the present invention relates to a method of treating microelectronic substrate, comprising the steps of:
  a) positioning the microelectronic substrate on a substrate holding portion of a chuck in a sealed process chamber;
  b) providing a nozzle assembly that is coupled directly or indirectly to a flexible bellows in a manner effective to allow the nozzle assembly to be moved and positioned relative to the substrate holding portion in response to movement and positioning of the moveable bellows portion;
  c) supplying at least one fluid to the nozzle assembly; and
  d) dispensing the at least one fluid from the nozzle assembly in to the sealed chamber in a manner effective to treat the microelectronic substrate with the fluid.

BRIEF DESCRIPTION OF THE DRAWINGS

FIG. 1B is a close-up, schematic view of a portion of the tool system of FIG. 1a.

FIG. 2 is a schematic side view in cross-section showing a portion of the tool system of FIG. 1A so that features of the flexible and resizable chamber are seen in more detail.

FIG. 4 is a schematic side view in cross-section showing a portion of the tool system of FIG. 1A so that features of the flexible and resizable chamber are seen in more detail, wherein FIG. 4 shows the flexible and resizable chamber as contracted relative to the configurations of FIG. 1a to lower the nozzle assembly relative to the substrate.

FIG. 5 shows an alternative configuration of the tool system of FIG. 1A in which the flexible and resizable chamber has been tilted relative to the configuration of FIG. 1A to tilt the nozzle assembly relative to the substrate.

FIG. 6 is a schematic side view in cross-section showing a portion of the tool system of FIG. 1A so that features of the flexible and resizable chamber are seen in more detail, wherein FIG. 4 shows the flexible and resizable chamber as tilted relative to the configurations of FIG. 1A to tilt the nozzle assembly relative to the substrate.

FIG. 7 shows an optional configuration of a portion of the tool system of FIG. 1A in which a motor drives a tie rod, and the driven tie rod is coupled to other tie rods by a chain and sprockets so that the tie rods are rotatably driven in a uniform manner.

FIG. 8 shows an alternative configuration of a portion of the tool system of FIG. 1A in which a hinged gimbal is incorporated into the flexible and resizable enclosure.

DETAILED DESCRIPTION OF PRESENT PREFERRED EMBODIMENTS

Figure 1A:
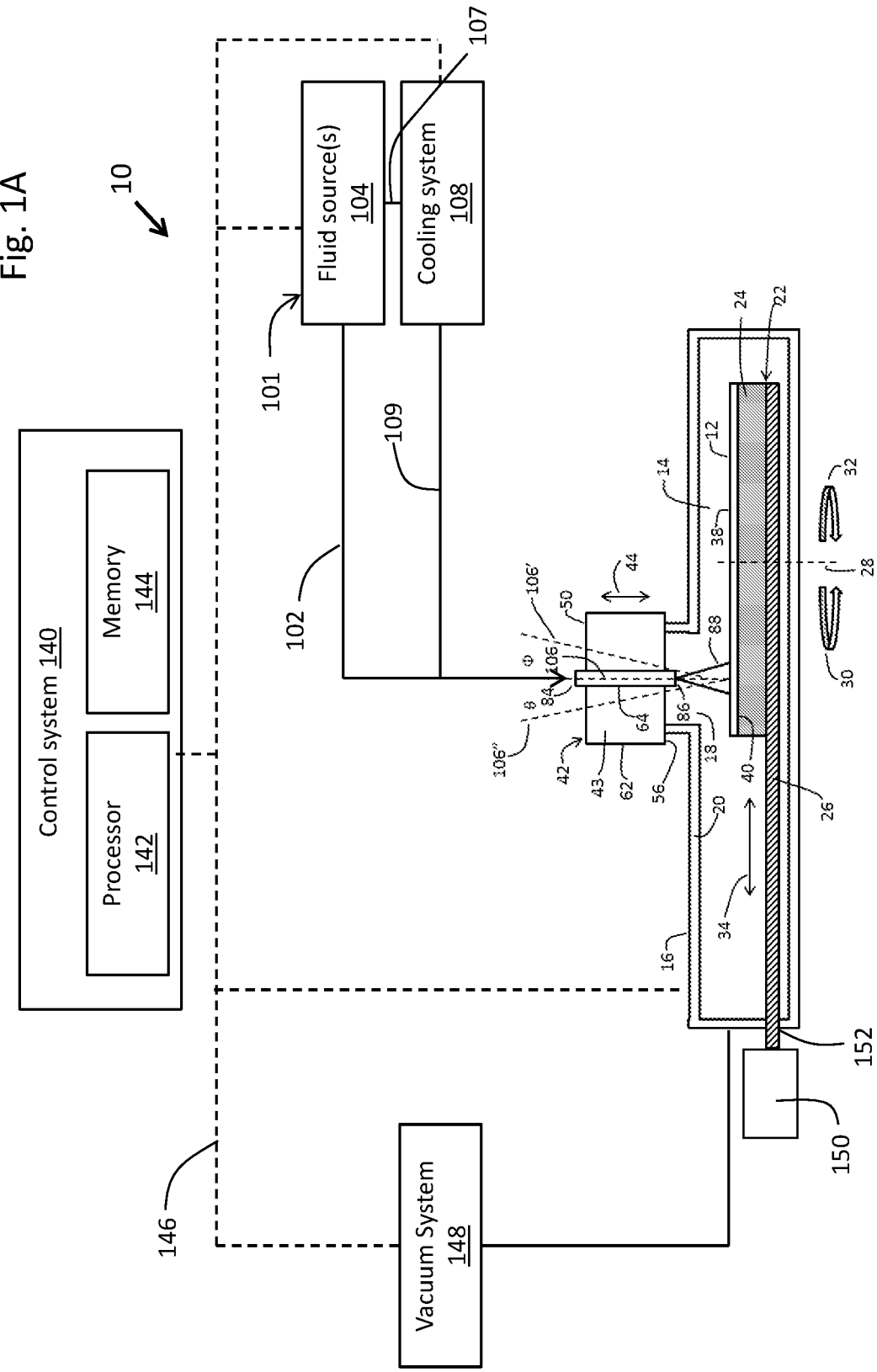
FIG. 1A is a schematic side view of a treatment tool system incorporating principles of the present invention.

The present invention will now be further described with reference to the following illustrative embodiments. The embodiments of the present invention described below are not intended to be exhaustive or to limit the invention to the precise forms disclosed in the following detailed description. Rather a purpose of the embodiments chosen and described is so that the appreciation and understanding by others skilled in the art of the principles and practices of the present invention can be facilitated.

One embodiment of a tool system 10 of the present invention is schematically shown in FIGS. 1 through 6. Tool system 10 is useful for spraying one or more treatment fluids onto a microelectronic workpiece 12 in a sealed chamber 14. Referring first to FIGS. 1 and 2, system 10 includes housing 16 defining the sealed chamber 14. Workpiece 12 is supported on a substrate holding portion 24 of a chuck 22. Workpiece 12 has an upper surface 38 and lower surface 40.

Chuck 22 in this illustrative embodiment is configured to translate back and forth on demand in a controlled fashion through sealed chamber 14 as schematically shown by back and forth translation arrow 34. One or more translation arms 26 are coupled to the chuck 22 and extend through the housing 16 to external actuation components in the form of a translational drive system 150 that actuates the arms 26 to cause the chuck to translate on demand. A seal interface 152 provides an environmentally tight seal to help maintain the protected environment, e.g., vacuum in some modes of practice, inside chamber 14 during translation. In addition to the translation motion along arrow 34, substrate holding portion 24 also may be configured to rotate about rotation axis 28 on demand either clockwise as shown by clockwise rotation arrow 32 or counterclockwise as shown by counterclockwise rotation arrow 30. Rotation of the substrate holding portion 24 causes corresponding rotation of the workpiece 12 supported on the chuck 22. Rotation about axis 28 may be continuous during a treatment or occur intermittently during one or more portions of a treatment. For example, rotation may occur intermittently in order to rotate workpiece 12 in an indexed fashion into specific rotational position(s) in coordination with a process treatment. The rotation, whether continuous or intermittent, may be coordinated with translation of the chuck.

Translation of chuck 22 along the path of arrow 34 allows the microelectronic substrate 102 to be moved through the treatment spray 88. In practical effect, translation of chuck 22 helps the spray 88 scan across substrate 38 optionally as substrate 38 rotates. Translation can be distinguished from rotation in that translation of chuck 22 causes the rotation axis 28 of chuck 22 to move from one location in chamber 14 to another location. In rotation, the relative position between rotation axis 28 and chuck 22 does not change even as chuck 22 translates within chamber 14.

The translation drive system 150 may comprise any electrical, mechanical, electromechanical, hydraulic, or pneumatic device to allow actuation of rods 26. The translation drive system 150 may be designed to provide a range of motion sufficient to permit desired translation of the microelectronic substrate 38 to facilitate loading, unloading, and treatment operations. For example, during at treatment, substrate 38 is scanned at least partly through the area of treatment spray 88. During treatments, the substrate 38 can be translated to cause the spray 88 to scan across a portion or the entire diameter of the substrate 38 at a suitable rate, such as up to 300 mm/sec, such that the spray 88 scans the desired portions of the substrate 38. In many embodiments, translation and/or rotation occur so that the treatment spray 88 treats the entire surface of the substrate 38. In conjunction with the translational movement of chuck 24, the substrate 38 rotates to assist with full surface treatment.

Housing 16 includes an egress 18 in an upper wall 20. A flexible and resizable enclosure 42 is mounted onto housing 16 over the egress 18. The enclosure 42 generally includes an upper, moveable flange 50, base plate 56, and a flexible bellows 62 that couples the moveable flange 50 to the base plate 56. Upper, moveable flange 50 includes a central aperture for mounting the nozzle assembly 64 (described further below). Upper, moveable flange 50 also includes apertures 54 to receive the tie rods 120 (described further below).

Base plate 56 is fixedly mounted to housing 16. O-rings 95 help to provide a fluid tight seal at this interface. Base plate 56 includes a central aperture 58 to provide open communication between the interior 43 of enclosure 42 and the rest of the sealed chamber 14. Base plate 56 includes threaded apertures 60 to receive the tie rods 120.

Flexible bellows 62 couples the upper, moveable flange 50 to the base plate 56. The bellows 62 generally includes a plurality of stacked convolutions that can be stretched to expand the length of the bellows or contracted to shorten the length of the bellows. Some bellows are sufficiently flexible to allow convolutions on one side to be more compressed (or stretched) than on the other side. Such differential resizing causes the ends of the bellows to flex relative to each other. Flexible bellows 62 allows the position (e.g., the height) and/or orientation (e.g., the tilt) of the upper, moveable flange 50 to be adjusted through a suitable range of motion while still ensuring that the interior 43 of enclosure 42 is isolated from the ambient. The bellows 62 is designed to have sufficient range of expansion/contraction/and/or tilting to allow the desired amount of variability in the distance d1 (FIG. 2) between the nozzle tip 72 and the workpiece 12 or orientation of main axis 106 with respect to the workpiece upper surface 38.

Many different kinds of flexible bellows are commercially available from a variety of commercial sources. Suitable bellows are generally airtight to help protect the sealed chamber 14 against ambient contamination and are sufficiently robust to function with the pressure differential between the ambient and the sealed chamber 14. Examples of suitable bellows include welded metal bellows, formed metal bellows, electroformed metal bellows, and the like. Suitable bellows may be fabricated from a wide range of materials, such as stainless steel, fluoropolymers, and the like.

Bellows 62 including at least stainless steel are suitable in many embodiments. Typically, welded metal bellows would be more suitable for applications in which the emphasis is on modes of operation with a greater range associated with d1 (e.g., a range of motion that allows the distance d1 to have a distance variation of 5 mm or greater, while formed metal bellows would be more suitable for applications with an emphasis on relatively small changes in d1, e.g., a variation of d1 of less than 20 mm or for tilting applications that emphasize varying angle Φ as opposed to distance d1.

In many modes of practice, flexible bellows 62 is adjustable to allow the upper flange 50 to be raised and lowered on demand as shown by arrow 44 in order to increase or decrease the distance d1. In one mode of practice, bellows 62 is configured to allow the upper flange 50 to be moved such that the distance d1 between the nozzle tip 72 at the end of the nozzle assembly 64 and the upper surface 38 of the workpiece 12 to be adjusted in a range such as from 1 mm to 150 mm, preferably 2 mm to 100 mm, more preferably 2 mm to 50 mm.

Figure 1B:
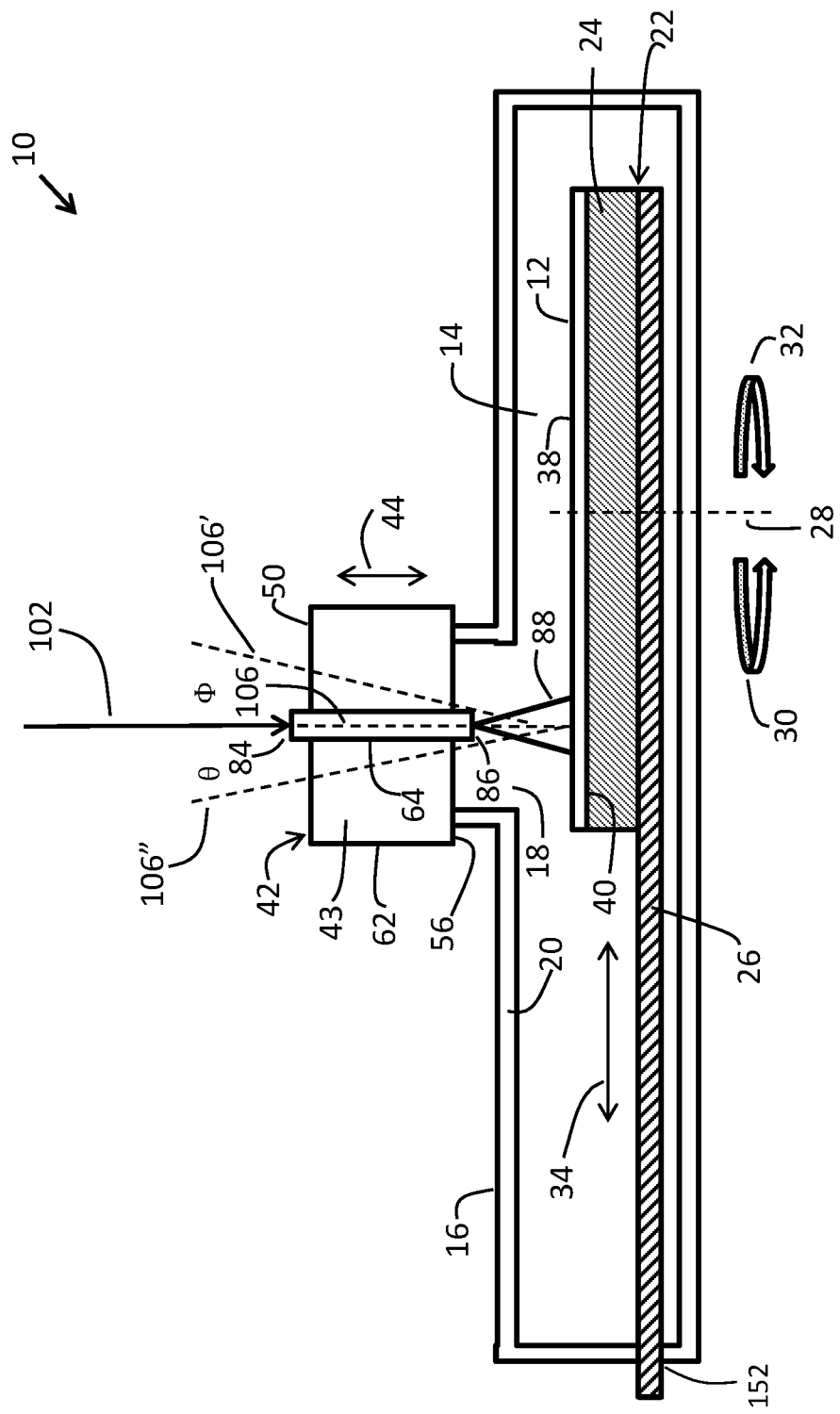

Flexible bellows 62 also may be configured so that the upper flange 50 can be tilted to cause the main axis 106 of nozzle assembly 64 to be tilted on demand with respect to the upper surface 38 of the substrate. The adjustments desirably may allow nozzle assembly 64 to be tilted so that nozzle assembly 64 is aimed radially outward, radially inward, or along a chord with respect to the workpiece 12. For example, nozzle assembly 64 may be adjusted so that main axis 106 is perpendicular to the upper surface 38. Such a configuration shall be referred to as the vertical configuration or the neutral configuration. In some modes of practice, the main axis 106 of nozzle assembly 64 may be tilted in any direction such as at an angle in the range from 0 degrees to 45 degrees with respect to the axis 46. For example, as schematically shown in FIGS. 1a and 1b, upper flange 50 and main axis 106 could be tilted at an angle of Φ (shown as axis 106') with respect to the vertical configuration as one example or to an angle θ (shown as axis 106") as another example.

Nozzle assembly 64 generally includes a nozzle inlet 84 through which one or more fluids are supplied to nozzle assembly 64 by a supply system 101. In those modes of practice in which system 10 is used to carry out a cryogenic treatment, the one or more fluids generally are pressurized and cooled as supplied to the nozzle assembly 64. For example, each pressurized and cooled fluid independently may be supplied to the nozzle assembly 64 at a temperature in the range from 70 K to 150 K and a pressure in the range from 10 psig to 100 psig.

The supply system 101 includes one or more fluid sources 104. Such fluids may be gases and/or liquids. Preferably, the fluids comprise at least one gas. Examples of suitable gases or liquids include one or more of nitrogen, argon, He, hydrogen, Xe, $CO_2$, neon, krypton, combinations of these, and the like. In one embodiment, the pressurized and cooled gas or liquid is argon. In another embodiment, the pressurized and cooled gas or liquid is nitrogen. In another embodiment, the pressurized and cooled gas or liquid comprises nitrogen and argon at a molar ratio of argon to nitrogen in the range from 1:100 to 100:1, preferably 1:20 to 20:1, more preferably 1:10 to 10:1. In those embodiments comprising carbon dioxide, nitrogen and/or argon, the fluid may further comprise one or more additional gases or liquids as well. In one embodiment, the additional gas or liquids comprise helium, hydrogen, neon, or a combination of these wherein the molar ratio of the total amount of the additional gas(es) to the argon, carbon dioxide and/or nitrogen is in the range from 1:100 to 100:1, preferably 1:1 to 10:1. Specific mixtures include argon and helium; argon and hydrogen; argon, hydrogen, and helium; nitrogen and helium; nitrogen and hydrogen; nitrogen, hydrogen, and helium; carbon dioxide. hydrogen, and helium.

Supply system 101 includes one or more supply lines such as supply line 102 that fluidly couple nozzle assembly 64 to one or more fluid sources. Optionally, in addition to supply line(s) 102 and sources 104, supply system 101 may include other features to help deliver fluid(s) to nozzle assembly 64 in a desired condition. For example, supply system 101 may include components (not shown) that filter, cool, heat, regulate or control pressure, regulate or control flow, or otherwise treat the incoming supply fluid(s). Fluids may be supplied singly, in mixtures, sequentially, or in any suitable fashion in order to carry out a desired treatment.

Optionally, the fluid supply system may incorporate a cooling system 108 to cool the fluid(s) to a desired temperature prior to being expanded through nozzle assembly 64 and dispensed into the sealed chamber 14. Fluid is supplied from fluid sources 104 to cooling system 108 by line 107. The cooled fluid is supplied from cooling system 104 to feed line 102 via line 109.

The supplied fluid(s) are then dispensed from nozzle assembly 64 through nozzle outlet 86 at tip 72 as a spray 88. Spray 88 is aimed at workpiece 12 in sealed chamber 14. The nozzle tip 72 is mounted in a manner effective to position the nozzle tip 72 at a distance d1 between the nozzle tip 72 and the upper surface 38 of the workpiece 12. In the practice of the present invention, this distance d1 can be easily adjusted on demand through a desired range of motion in order to change the distance d1 and vary the size of the gap between the nozzle tip 72 and the upper surface 38 of the workpiece 12.

In illustrative modes of practice, system 10 is used to carry out cryogenic treatments in which pressured and cooled fluid(s) are supplied to nozzle assembly 64 and then jetted through nozzle assembly 64 at the workpiece 12 to remove contamination while the sealed chamber 14 is maintained under vacuum. Exemplary modes of carrying out such cleaning treatments are described in Assignee's U.S. patents and co-pending U.S. patent applications as follows: U.S. Pat. Nos. 10,062,596; 10,020,217; and 10,014,191; U.S. Pat. Pub. Nos. 2016/0096206A1; 2016/0096207A1; 2018/0025904A1; 2017/0341093A1; and 2018/0269080A1. See also U.S. Pat. No. 6,284,006B1, which describes processing tools for microelectronic workpieces in which a polymer bellows is used to help accomplish substrate transport.

Nozzle assembly 64 generally includes an upper nozzle body 66, lower nozzle body 71, orifice plate 80, O-rings 96, and the nozzle mounting assembly 110. Upper nozzle body 66 includes fluid passageway 69 extending through the length of upper nozzle body 66 along the main axis 106 of the nozzle assembly 64. Bottom flange 68 extends outward from the lower rim 70.

Lower nozzle body 71 includes an upper flange 74 extending from upper rim 76. Flange 74 is attached to flange 68 in order to attach lower nozzle body 71 to upper nozzle body 66. Lower nozzle body 71 extends from the upper rim 76 to the nozzle tip 72. Fluid spray 88 is dispensed through outlet 86 at nozzle tip 72. Fluid passageway 75 extends through lower nozzle body 71 along the main axis 106 of the nozzle assembly 64. Fluid passageway 75 includes a flaring portion 77 that provides an expansion zone for fluids that are dispensed through nozzle assembly 64. The flaring portion 77 helps to accelerate the fluids to supersonic velocities in some embodiments.

The nozzle bodies 66 and 71 can be fixedly coupled together such as by welds, brazes, or the like. More desirably, these are coupled by hardware (not shown) that allow the lower nozzle body 71 to be removed for service, maintenance, replacement with a different tip, access to change the orifice plate, or the like.

Orifice plate 80 is sandwiched between upper nozzle body 66 and lower nozzle body 71 and fixed in place when lower nozzle body 71 is mounted to the upper nozzle body 66. Orifice plate 80 includes a centrally located orifice 82. Orifice 82 creates a constriction in the flow of fluid through nozzle assembly 62 and can be repeatedly machined to very tight tolerances. The highly uniform orifice size among a set of orifice plates helps to create a more repeatable spray within a process chamber as well as helping to create more uniform spray performance among different chambers configured with the same orifice size. For example, a tool may be configured with multiple process chambers, and using these orifice plates allows the performance of each chamber to be highly matched. The orifice plates also can be swapped with other plates to allow the orifice size to be easily changed on demand to alter the process conditions.

Orifice plate 80 may be exchanged with other orifice plates in order to change the size of the orifice 82, and hence the degree of constriction between the fluid passageway 69 and the fluid passageway 75. Access to exchange orifice plate 80 is easily achieved by removing lower nozzle body 71 from the upper nozzle body 64. O-rings 96 help to provide a fluid tight seal among the upper nozzle body 64, the lower nozzle body 71, and the orifice plate 80.

Nozzle mounting assembly 110 generally includes mounting plate 111 and tube 112. Tube 112 may be integrally formed with mounting plate 11. Alternatively, mounting plate 111 and tube 112 may be separate components that are assembled together. When formed as separate components, the interface between mounting plate 111 and tube 112 may be insulated in order to reduce heat transfer between the components. This may be accomplished by insulting the interface with insulating componentry (not shown) or by forming mounting plate 111 from a material with suitably low thermal conductivity such as a fluoropolymer. Mounting plate 111 is coupled to the upper, moveable flange 50. This may be accomplished using suitable fasteners (not shown) that allow nozzle assembly 64 to be removed. O-ring 94 helps to provide a fluid tight seal between mounting plate 111 and flange 50.

Tube 112 includes inlet tube portion 114 extending above mounting plate 111 and outlet tube portion 116 extending below mounting plate 111. Inlet tube portion 114 provides a feature to attach mounting assembly 110 to supply line(s) 102 by suitable coupling components (not shown). Outlet tube portion 116 provides a feature to attach upper nozzle body 66 to mounting assembly 110. For purposes of illustration, VCR fitting 78 is used to attach outlet tube portion 116 to upper nozzle body 66. Examples of VCR fittings are commercially available under the trade designation SWAGELOCK®.

Fluid passageway 118 extends through mounting assembly 110 along the main axis 106 of nozzle assembly 64. The fluid passageways 69, 75, and 118 are aligned when the components of nozzle assembly 64 are assembled. In practical effect, passageways 75 and 118 from a composite nozzle reservoir chamber that is separated from the flaring, outlet passageway 69 by the constriction orifice 82.

Once the inside of the sealed chamber 14 and the interior 43 of the resizable enclosure 42 are evacuated to establish a vacuum, the forces from ambient pressure pressing on the outer surfaces of the bellows 62 could collapse or otherwise undesirably deform the bellows 62. Accordingly, it is desirable to provide a structure that supports the bellows while still allowing the bellows 62 to constrict, expand, tilt, and/or otherwise move as desired. As an additional function, tie rods 120 (FIG. 2) may be rotatably driven in a way to help raise, lower, or tilt moveable flange 50 relative to base plate 56.

As one way to fulfill one or more of these purposes, tie rods 120 are used to help hold the moveable flange 50 and the base plate 56 apart, and thereby help prevent the bellows 62 from collapsing under pressure forces. One or more tie rods 120 are used. Preferably 2 or 3 tie rods 120 are used. When two or more tie rods 120 are used, it may be convenient to space these in equal increments (e.g., 3 tie rods 120 spaced 120 degrees apart) around the perimeter of bellows 62.

As shown best in FIG. 2, tie rods 120 couple mounting flange 50 to base plate 56. Threaded ends 122 threadably engage apertures 60 in base plate 56. The upper ends of the rods 120 are rotatably mounted in the apertures 54 of flange 50 so that the tie rods 120 can rotate freely in apertures 54 without threaded engagement. Nut and washer assemblies 124 fix the axial position of the tie rods 120 with respect to flange 50. As a result, when tie rods 120 rotate, the threadable engagement between ends 122 and apertures 60 tends to either pull the rods 120 downward or upward relative to base plate 56, depending on the direction of rotation. This in turn expands or contracts the length of bellows 62. This in turn raises or lowers the moveable flange 50 and the nozzle assembly 64 with respect to the surface 38 of the workpiece 12. In this way, actuation of the tie rods 120 can be used to raise, lower, or tilt nozzle assembly 64 in order to adjust the distance d1 as desired.

The actuation of the tie rods 120 can be done manually, such as by using components (not shown) such as knobs or hand tools such as a wrench. The rotation of the tie rods 120 can also be manually or automatically driven by actuation components (not shown) such as one or more electric motors in order to automate the expansion/contraction of the bellows 62. As an option, the system 10 may include a drive chain 128 (See FIG. 7 and corresponding discussion below) mounted on sprockets 126 on the tie rods 120. This couples the tie rods 120 together so that actuated rotation of one tie rod 120 by a single motor is transferred to the others via the chain and sprockets 126. By using similar threaded features and sprockets 126, linking the tie rods 120 together in this way and driving one rod 120 in tandem with the other rods 120 helps to ensure that bellows 62 expands and contracts uniformly without slanting the nozzle assembly 64 in an undesired direction.

Sealed chamber 14 may be evacuated and placed under vacuum using vacuum system 148. Vacuum system 148 may be used to establish and to maintain sealed chamber 14 at any desired appropriate sub-atmospheric, process pressure. The vacuum system 148 may include one or more pumps (not shown) to enable establishing vacuum pressures to a desired level.

A control system 140 (which may include one or more integrated control devices) may be used to monitor, receive, and/or store process information. For example, control system 140 may include a memory 144 to store process recipes, command structures, user interfaces, real time process information, historical process information, feed supply, temperature control, pressure control, heating control, chuck levitation and rotation, chuck translation, substrate loading and unloading, substrate securement on the chuck 24, process control feedback, and the like. Control system 140 may use a computer processor 142 to implement these operations and to receive and issue instructions and other signals over a network 146 that interfaces with the other components of system 10. For example, the control system 140 may control a heater assembly (not shown) incorporated into chuck 24 to adjust the temperature of the substrate 38 for purposes such as to minimize thermal distortion and/or prevent condensation on the substrate 38 or on the chuck 24.

Figure 3:
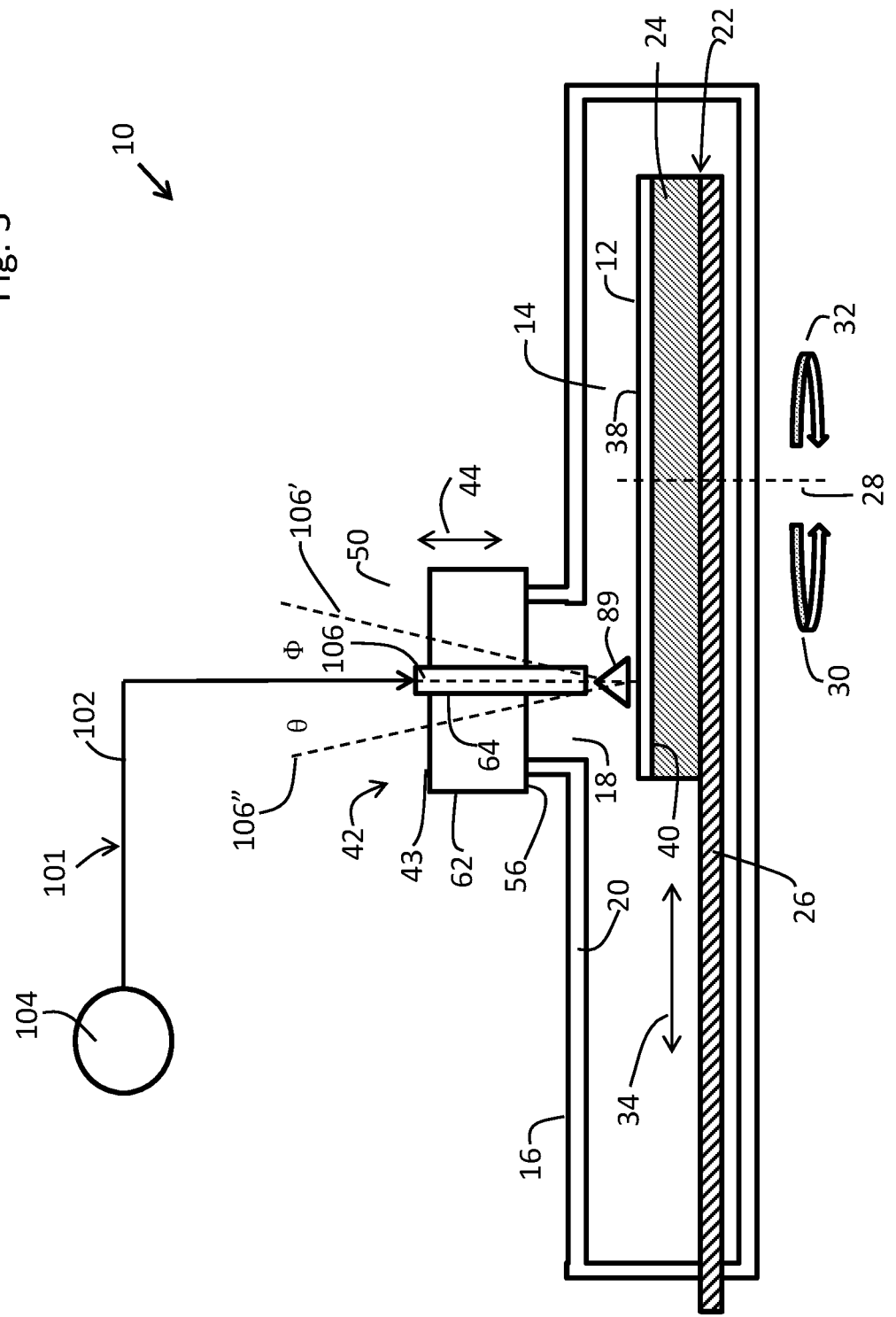
FIG. 3 shows an alternative configuration of the tool system of FIG. 1A in which the flexible and resizable chamber has been contracted relative to the configuration of FIG. 1a to lower the nozzle assembly relative to the substrate.
Figure 4:
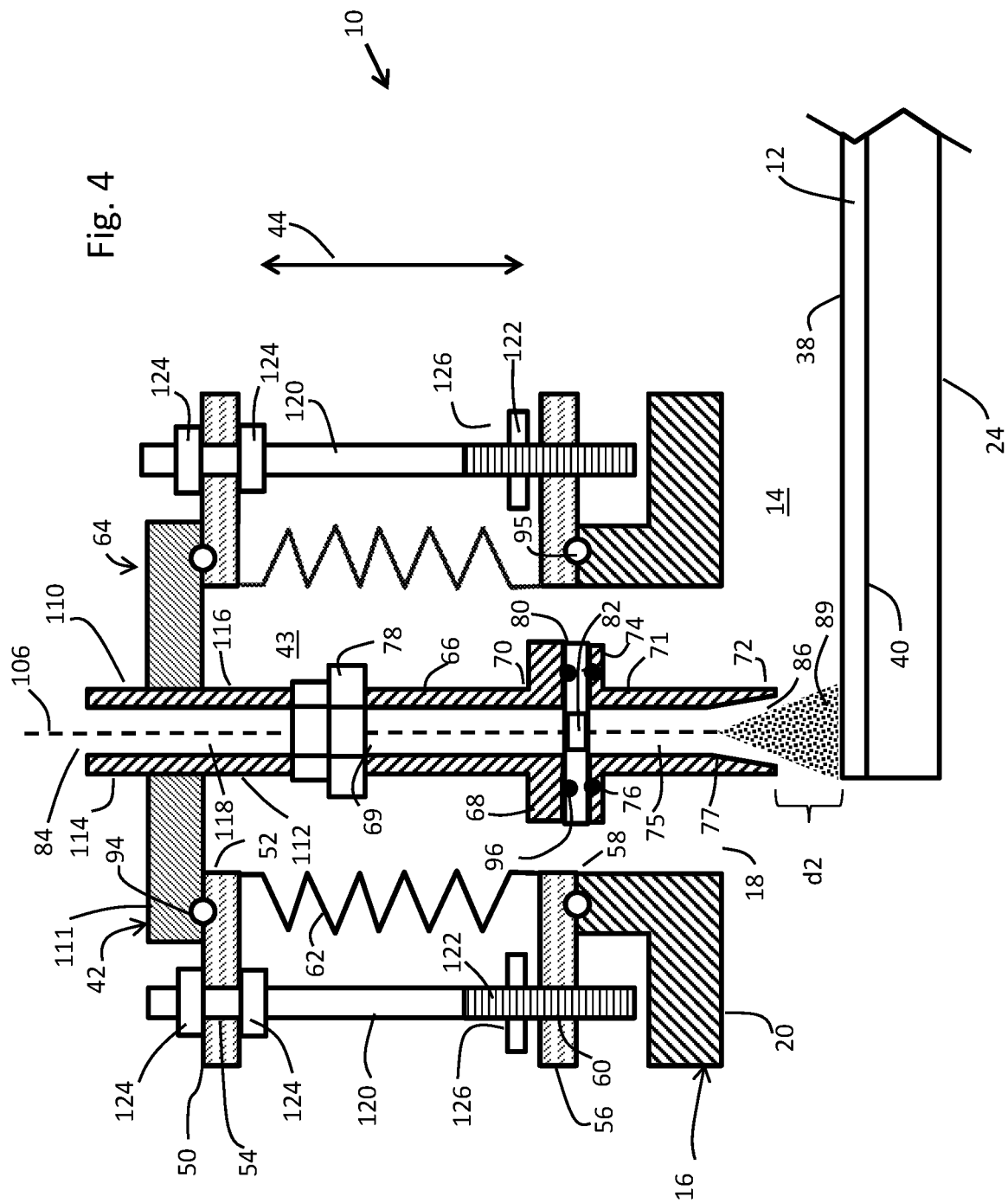

FIGS. 3 and 4 show an alternative configuration of system 10. Tie rods 120 have been rotatably driven in order to drive the tie rods 120 and moveable flange 50 downward and compress the bellows 62. This in turn lowers the moveable flange 50 as well as the nozzle assembly 64 so that nozzle assembly 64 is at a closer distance d2 to the workpiece 12 providing a smaller gap as compared to the distance d1 of FIGS. 1 and 2. The resulting spray 89 is more dense, having less of a distance by which to expand as compared to spray 88 of FIGS. 1 and 2. Counterintuitively, in some modes of practice in which the distance d2 is under 50 mm or even under 20 mm, or even under 10 mm, spray 89 could actually clean a larger footprint on workpiece 12 as compared to spray 88 in that the closer spacing causes the spray to expand radially outward more forcefully from beneath the nozzle area.

FIGS. 5 and 6 show another configuration of system 10. In this case, moveable flange 50 is tilted so that main axis 106 is at an angle θ relative to the vertical configuration. In this case, rather than compress and expand the bellows 62, one side of flange 50 is tilted more with respect to the base plate 56. This tends to expand the convolutions on one side of the bellows 62, while compressing the convolutions on the opposite side. Desirably, a mechanical structure is used to help prevent collapse of the bellows 62 due to ambient pressure forces when the sealed chamber 14 is under vacuum. In such modes of practice, a hinged gimbal mechanism 130 (FIG. 8) would be a suitable support and actuation system. An actuation device such as an electric motor may be used for manual or automatic actuation. The tilted nozzle assembly 64 produces a spray 90 in this configuration.

FIG. 7 schematically shows a portion of system 10 (FIGS. 1A, 1B, 2, 3, 4, 5, 6) constituting flexible and re-sizable enclosure 42 including the flexible bellows 62 supported between the moveable flange 50 and the base plate 56. FIG. 7 shows an approach by which the rotation of the tie rods 120 are tied together using drive chain 128 that drivingly engages sprockets 126 on the tie rods 120. At least one electric motor 132 is mounted and supported upon a motor mount 134. The motor 132 has a shaft and sprocket 136 that rotationally engage and drive the chain 128. The driven chain 128 in turn rotationally drives one or more of the rods 120. For purposes of illustration, the chain 128 is driven along a pathway to rotationally drive two or more tie rods 120. The chain 128 and sprockets 126 rotate the tie rods 120 so that all turn uniformly. Depending on the direction of rotation of the tie rods 120, the tie rods 120 are threadably driven up or down in base plate 56. This in turn causes corresponding raising or lowering of moveable flange 50 to expand or contract flexible bellows 62. This uniform motion helps to ensure that the bellows 62 expands and contracts in a level fashion without slanting the nozzle in any direction. In other embodiments, the tie rods 120 may be independently driven so that one tie rod 120, for instance, collapses or expands the bellows 62 more on one side than one or more other tie rods positioned at other site(s) around the bellows 62. This would allow the tie rod actuation to control both expansion and contraction of the bellows 62 as well as tilting of the bellows 62. This would cause corresponding raising or lowering of the nozzle assembly 64 (not shown in FIG. 7) to change the distance d1 (FIG. 2) or to change the angle at which the main axis 106 (FIGS. 1a, 1b, and 2) is tilted, respectively.

FIG. 8 shows a simplified representation of an alternative embodiment of flexible and resizable enclosure 42 (FIG. 1A) configured with a hinged gimbal mechanism 140 to adjust the angle of nozzle assembly 64 (FIG. 1A) within the sealed chamber 14 (FIG. 1A). Rather than compress, expand, and/or tilt the bellows 62 using tie rods 120 as shown in FIG. 7, moveable flange 50 is tilted with respect to the base plate 56 using the gimbal mechanism 140. The gimbal mechanism 140 also helps to structurally support the bellows 62 to prevent collapse or other degradation due to ambient pressure forces acting on the bellows 62 when the sealed chamber 14 (FIG. 1A) is placed under vacuum. When the bellows 62 is tilted, this tends to expand the bellows convolutions on one side of the bellows 62, while compressing the convolutions on the opposite side. FIG. 8 shows a hinged gimbal mechanism 140 with upper gimbal support 142 pivotably coupled to lower gimbal support 140 by gimbal hinge 146 on one side of the enclosure 42. Similar upper and lower gimbal supports and a hinge pivotably connecting these would be provided on the other side of the enclosure 42 as well. Upper gimbal supports 142 are attached to the moveable flange 50. The lower gimbal supports 144 are connected to the base plate 56. Upper gimbal supports 142 can pivot relative to the lower gimbal supports 144 about the hinges 146. This allows upper gimbal supports 142, and hence the moveable plate 50 and upper end of the bellows 62 to tilt clockwise or counterclockwise relative to the lower gimbal supports 144 and base plate 56. This allows the two ends of the bellows 62 to tilt with respect to each other while still preventing the collapse of the bellows 62. This relative tilting motion can be driven manually. An electric motor could also be used to drive the angular displacement automatically. Hinged gimbal mechanisms are commercially available from sources such as Bellows Technology Limited (United Kingdom).

All patents, patent applications, and publications cited herein are incorporated by reference in their respective entireties for all purposes. The foregoing detailed description has been given for clarity of understanding only. No unnecessary limitations are to be understood therefrom. The invention is not limited to the exact details shown and described, for variations obvious to one skilled in the art will be included within the invention defined by the claims.

What is claimed is:

1. A system for treating a microelectronic substrate with at least one treatment fluid, said system comprising:
    a) a housing enclosing a sealed chamber, wherein the housing includes an egress in an upper wall;
    b) a chuck comprising a substrate holding portion in the sealed chamber, wherein the microelectronic substrate is positioned on the substrate holding portion during a process treatment;
    c) a flexible and/or resizable enclosure coupled to the sealed chamber and mounted onto the housing over the egress, said flexible and/or resizable enclosure comprising a flexible bellows coupled to a moveable and positionable support member in a manner such that actuation of the flexible bellows moves the moveable and positionable support member;
    d) a moveable and positionable nozzle assembly coupled to the support member in a manner effective to allow the nozzle assembly to be moved and positioned relative to the substrate holding portion in response to movement and positioning of the moveable and positionable support member in response to actuation of the flexible bellows, wherein the nozzle assembly comprises at least one inlet to receive at least one fluid from at least one fluid supply and at least one outlet to introduce at least one fluid into the sealed chamber.

2. The system of claim 1, wherein the substrate holding portion is translatable while holding the microelectronic substrate.

3. The system of claim 1, wherein the substrate holding portion is rotatable while holding the microelectronic substrate.

4. The system of claim 1, wherein the flexible and/or resizable enclosure further includes a base plate coupled to the flexible bellows, and wherein the base plate is coupled to a housing that encloses at least a portion of the sealed chamber.

5. The system of claim 4, wherein the base plate includes an aperture that provides open communication between an interior of the flexible and/or re-sizeable enclosure and the rest of the sealed chamber.

6. The system of claim 4, wherein the flexible bellows couples the base plate to the moveable and positionable support member.

7. The system of claim 4, wherein at least one tie rod interconnects the base plate and the moveable and/or positionable support member.

8. The system of claim 7, wherein at least one tie rod threadably engages the base plate in a manner such that rotation of the at least one tie rod moves the moveable and/or positionable support member relative to the substrate.

9. The system of claim 4, wherein a hinged gimbal mechanism interconnects the base plate and the moveable and/or positionable support member.

10. The system of claim 1, wherein the flexible bellows is a formed metal bellows.

11. The system of claim 1, wherein the flexible bellows is a welded metal bellows.

12. The system of claim 1, wherein the flexible bellows is configured to allow a distance between a nozzle tip of the nozzle assembly and an upper surface of the microelectronic substrate to be adjusted in at least a range from 1 mm to 150 mm.

13. The system of claim 1, wherein the flexible bellows is configured to allow a distance between a nozzle tip of the nozzle assembly and an upper surface of the microelectronic substrate to be adjusted in at least a range from 2 mm to 50 mm.

14. The system of claim 1, wherein the flexible bellows is configured to allow the moveable and positionable support member to be tilted with respect to an upper surface of the substrate.

15. The system of claim 1, wherein the flexible bellows is configured to allow the moveable and positionable support member to be raised and/or lowered with respect to an upper surface of the substrate.

16. The system of claim 1, wherein a pressurized and cooled fluid or fluid admixture is supplied to the inlet of the nozzle assembly.

17. The system of claim 16, wherein the pressurized and cooled fluid as supplied to the nozzle assembly is at a temperature in the range from 70 K to 150 K.

18. The system of claim 16, wherein the pressurized and cooled fluid as supplied to the nozzle assembly is at a pressure in the range from 10 psig to 100 psig.

19. The system of claim 16, wherein the pressurized and cooled fluid comprises nitrogen and/or argon.

20. The system of claim 16, wherein the pressurized and cooled fluid comprises one or more of He, $H_2$, Xe, $CO_2$, Ne, Kr, or combinations thereof.

21. The system of claim 16, wherein the pressurized and cooled fluid comprises He and $CO_2$.

22. The system of claim 16, wherein the pressurized and cooled fluid comprises $H_2$ and $CO_2$.

23. A system for treating a microelectronic substrate with at least one treatment fluid, said system comprising:
a) a sealed chamber;
b) a chuck comprising a substrate holding portion in the sealed chamber, wherein the microelectronic substrate is positioned on the substrate holding portion during a process treatment;
c) a flexible and/or resizable enclosure coupled to the sealed chamber, said flexible and/or resizable enclosure comprising a flexible bellows coupled to a moveable and positionable support member in a manner such that actuation of the flexible bellows moves the moveable and positionable support member, wherein at least one tie rod supports the moveable and positionable support member; and
d) a moveable and positionable nozzle assembly coupled to the support member in a manner effective to allow the nozzle assembly to be moved and positioned relative to the substrate holding portion in response to movement and positioning of the moveable and positionable support member in response to actuation of the flexible bellows, wherein the nozzle assembly comprises at least one inlet to receive at least one fluid from at least one fluid supply and at least one outlet to introduce at least one fluid into the sealed chamber.

* * * * *